United States Patent

Ghassemi et al.

[11] Patent Number: 5,572,467
[45] Date of Patent: Nov. 5, 1996

[54] ADDRESS COMPARISON IN AN INTEGRATED CIRCUIT MEMORY HAVING SHARED READ GLOBAL DATA LINES

[75] Inventors: Hamed Ghassemi; Perry H. Pelley, III; Scott G. Nogle, all of Austin, Tex.

[73] Assignee: Motorola, Inc., Schaumburg, Ill.

[21] Appl. No.: 426,995

[22] Filed: Apr. 24, 1995

[51] Int. Cl.[6] .................................................. G11C 7/00
[52] U.S. Cl. ................... 365/189.02; 365/165.07; 365/189.05; 365/208; 365/190; 365/225.6; 365/177; 365/189.08
[58] Field of Search ................. 365/189.02, 189.07, 365/189.05, 190, 207, 225.6, 177, 189.08, 208

[56] References Cited

U.S. PATENT DOCUMENTS

5,502,676  3/1996  Pelley, III et al. ........................ 365/200

Primary Examiner—David C. Nelms
Assistant Examiner—Andrew Q. Tran
Attorney, Agent, or Firm—Daniel D. Hill

[57] ABSTRACT

A synchronous integrated circuit memory (30) has read global data lines shared between data read from a memory array (32) and data read from a data-in register (40) during a read-after-write. A comparator/latch (50) compares a new address to a previous address and generates an address match signal that is used to select match sense amplifiers (52) and deselect regular sense amplifiers (54). Relatively fast address comparison and address match signal generation is accomplished using a comparator/latch (50) for each column address signal, and emitter summing each match signal to provide the address match signal. The use of emitter summing reduces a number of gate delays, thus allowing the address match signal to be generated before the regular sense amplifiers (54) can be selected, and allowing the read global data lines to be shared without increasing the access time of the integrated circuit memory (30).

20 Claims, 4 Drawing Sheets

ADDRESS COMPARISON IN AN INTEGRATED CIRCUIT MEMORY HAVING SHARED READ GLOBAL DATA LINES

CROSS-REFERENCE TO RELATED, COPENDING APPLICATION

A related, copending application is entitled "Integrated Circuit Memory With Column Redundancy Having Shared Read Global Data Lines", by Perry H. Pelley III et al., now U.S. Pat. No. 5,502,676, assigned to the assignee hereof, and filed concurrently herewith.

FIELD OF THE INVENTION

This invention relates generally to integrated circuit memories, and more particularly, to address matching in an integrated circuit memory.

BACKGROUND OF THE INVENTION

Figure 1:
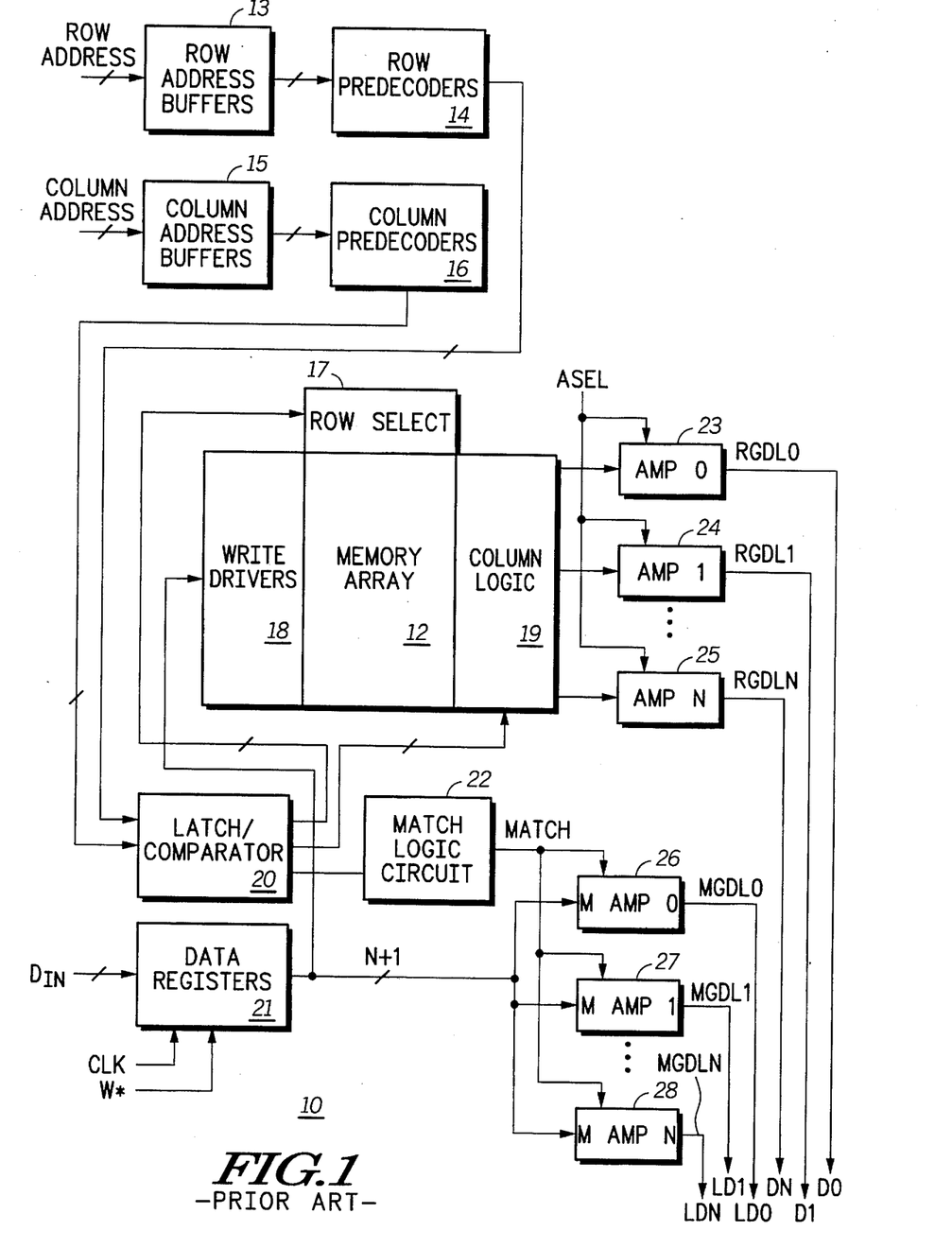
FIG. 1 illustrates, in block diagram form, an integrated circuit memory in accordance with the prior art.

FIG. 1 illustrates, in block diagram form, integrated circuit memory 10 in accordance with the prior art. Integrated circuit memory 10 includes memory array 12, row address buffers 13, row predecoders 14, column address buffers 15, column predecoders 16, row select 17, write drivers 18, column logic 19, latch/comparator 20, input data registers 21, match logic circuit 22, a plurality of regular sense amplifiers including sense amplifiers 23, 24, and 25, and a plurality of match sense amplifiers including match sense amplifiers 26, 27, and 28.

Integrated circuit memory 10 is a conventional synchronous static random access memory (SRAM) having a plurality of memory cells organized in rows and columns. The memory cells are coupled at intersections of the rows and columns. A row includes a word line and all of the memory cells coupled to the word line. A column includes a bit line pair and all of the memory cells coupled to the bit line pair.

A write cycle of integrated circuit memory 10 is initiated by asserting a write enable signal labeled "W*" as a logic low. Note that an asterisk (*) after a signal name indicates that the signal is a logical complement of a signal having the same name but lacking the asterisk (*). During a first clock cycle of a clock signal labeled "CLK", input data signals labeled "$D_{IN}$" are latched in data registers 21, row address signals labeled "ROW ADDRESS" are supplied to row address buffers 13, and column address signals labeled "COLUMN ADDRESS" are supplied to column address buffers 15. Row predecoders 14 and column predecoders 16 decode and latch the address signals on the first clock cycle. During a second clock cycle, the predecoded signals are latched and compared by latch/comparator 20 and provided to column logic 19 and to row select 17 to enable a word line and select a bit line pair to receive the input data signals. Input data signals $D_{IN}$ are written to a selected memory cell of memory array 12 using write drivers 18. A memory cell located at the intersection of the selected word line and bit line pair receives a differential data signal via the bit line pair corresponding to input data signal $D_{IN}$. During successive write cycles, new input data signals $D_{IN}$ can be latched in input data registers 21 on every clock cycle.

A read cycle is initiated by negating write enable signal W* as a logic high. In response to the address signals selecting a bit line pair and a word line, a memory cell located at the intersection of the word line and the bit line pair provides a relatively small differential voltage to the bit line pair. A select signal labeled "ASEL" enables the plurality of regular sense amplifiers and the relatively small differential voltage is sensed and amplified by one of sense amplifiers 23, 24, or 25 via column logic 19, and a corresponding data signal labeled "D0", "D1", or "DN" is provided to a read global data line labeled "RGDL0", "RGDL1", or "RGDLN", respectively, where N is an integer.

If a read cycle follows a write cycle at the same address, commonly known as a "read-after-write", data is read from input data registers 21 rather than from memory array 12, because the requested data has not yet been written to memory array 12. To determine when there is a read-after-write, latch/comparator 20 compares the new row and column addresses being accessed to a previous address, if there is a match, match logic circuit 22 provides a match signal labeled "MATCH" to enable each of the plurality of match sense amplifiers. Select signal ASEL is negated as a logic low to deselect the plurality of sense amplifiers 23, 24, and 25. Data is provided to the plurality of match sense amplifiers 26, 27, and 28 from input data registers 21. The plurality of match sense amplifiers are connected to a plurality match global data lines labeled "MGDL0", "MGDL1", and "MGDLN" and provide match data signals labeled "LD0", "LD1", and "LDN", corresponding to input data signals $D_{IN}$. Match data signals LD0, LD1, and LDN are multiplexed with data signals D0, D1, or DN (not shown), and the data signals are supplied to output circuitry (not shown), such as output buffers and/or registers.

In integrated circuit memories having both read global data lines and match global data lines, the surface area required to implement the integrated circuit memory may be significantly increased if the data organization, or word width of the integrated circuit memory, is very large. For example, an integrated circuit memory having a word width of 18 bits would require 18 read global data lines and 18 match global data lines. Also, the need to multiplex the match data signals with the regular data signals adds additional complexity to the back end of the memory. In addition, the regular sense amplifiers are generally not disabled during a read-after-write at the same address, causing increased power consumption.

DESCRIPTION OF A PREFERRED EMBODIMENT

Generally, the present invention provides a synchronous integrated circuit memory having read global data lines that are shared between data read from a memory array and data read from a data-in register during a read-after-write or registered write. In order to share the read global data lines, a comparator/latch compares a new address to a previous address and generates a match signal that is used to select the match sense amplifiers and deselect the regular sense amplifiers. The addresses must be compared, and a match signal generated, before the regular sense amplifiers can be selected, to prevent conflicting data on the data lines. The relatively fast address comparison and match signal generation is accomplished using a comparator/latch for each address signal, and emitter summing the match signals to provide the address match signal. The emitter summing reduces a gate delay, thus allowing the match signal to be generated before the regular sense amplifiers can be selected, and allowing the read global data lines to be shared without increasing the access time of the integrated circuit memory.

By sharing the read global data lines, the need for additional match read global data lines is eliminated, thus reducing semiconductor surface area required for the integrated circuit memory. Also, the need for a separate multiplexer in the back end is eliminated, and better signal tracking between the match data and regular data results. In addition, because the regular sense amplifiers are not selected during a read-after-write or during a registered write, power consumption is reduced.

The terms "assert" and "negate" are used when referring to the rendering of a signal, or similar apparatus, into its logically true or logically false state, respectively. If the logically true state is a digital logic level one, the logically false state is a digital logic level zero. And if the logically true state is a digital logic level zero, the logically false state is a digital logic level one.

Figure 2:
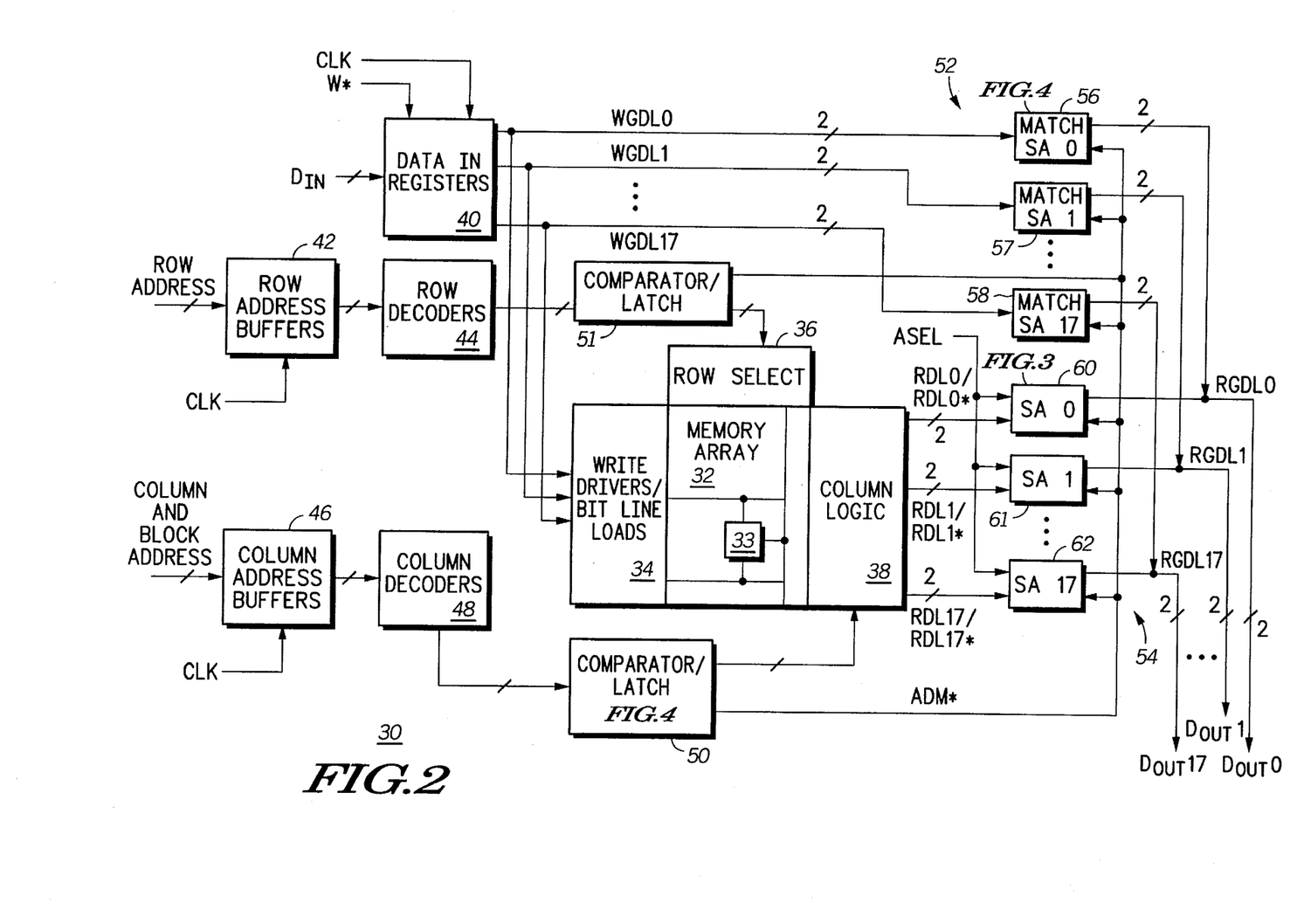
FIG. 2 illustrates, in block diagram form, an integrated circuit memory in accordance with the invention.

The present invention can be more fully described with reference to FIGS. 2–4. FIG. 2 illustrates, in block diagram form, integrated circuit memory 30 in accordance with the invention. Integrated circuit memory 30 includes memory array 32, write drivers/bit line loads 34, row select 36, column logic 38, input data registers 40, row address buffers 42, row decoders 44, column address buffers 46, column decoders 48, address comparator/latch 50, address comparator/latch 51, a plurality of match sense amplifiers 52, and a plurality of regular sense amplifiers 54. The plurality of match sense amplifiers 52 includes match sense amplifiers 56, 57, and 58. The plurality of regular sense amplifiers 52 includes sense amplifiers 60, 61, and 62.

Memory array 32 includes an array of static random access memory (SRAM) cells organized in a plurality of rows and a plurality of columns. Each memory cell is coupled to a bit line pair and to a word line. A representative memory cell 33 is shown connected to a bit line pair labeled "BL" and "BL*" and to a word line labeled "WL". A column includes a bit line pair and all of the memory cells coupled to the bit line pair. A row includes a word line and all of the memory cells coupled to the word line.

Row address buffers 42 receive a plurality of row address signals labeled "ROW ADDRESS" and provide a plurality of buffered differential row address signals row decoders 44 in response to a clock signal labeled "CLK". Column address buffers 46 receive a plurality of column address signals labeled "COLUMN ADDRESS", and provide a plurality of buffered differential column address signals to column decoders 48 in response to clock signal CLK. Row decoders 44 provide a plurality of decoded row address signals to input terminals of comparator/latch 51. Comparator/latch 51 has output terminals connected to row select 36. Column decoders 48 provide decoded column address signals to comparator/latch 50. Comparator/latch 50 has output terminals connected to column logic 38. Comparator/latch 50 is illustrated in more detail in FIG. 4. Comparator/latch 51 is similar to comparator/latch 50. In response to receiving the decoded row address signals, row select 36 selects a word line in memory array 32, and column logic 38 selects a bit line pair.

During a write cycle of integrated circuit memory 30, a plurality of input data signals labeled "$D_{IN}$", are provided to input terminals of data in registers 40. Differential data signals labeled "WGDL0", "WGDL1", through "WGDL17" are supplied to write drivers/bit line loads 34 one write clock cycle later. A row address and a column address select a word line and a bit line pair. A memory cell located at the intersection of the word line and the bit line pair receives a differential data signal via the bit line pair during a write cycle.

In the case of a normal read cycle, a memory cell located at the intersection of the word line and the bit line pair provides a differential data to the bit line pair. The selected bit line pair is coupled to a sense amplifier of regular sense amplifiers 54 via column logic 38, for providing one of differential data signals labeled "RDL0/RDL0*", "RDL1/RDL1*", through "RDL17/RDL17*". A select signal labeled "ASEL" is asserted to enable the regular sense amplifiers to provide the data to read global data lines labeled "RGDL0", "RGDL1", and "RGDL17". The read global data lines provide corresponding data signals labeled "$D_{OUT}0$", "$D_{OUT}1$", and "$D_{OUT}17$" to output circuitry (not shown). Note that the particular address signals have no special significance and may be different in other embodiments. Also, the amount of address decoding is not important for describing the invention and may be different in other embodiments.

Data is written into memory array 32 in two write clock cycles of clock signal CLK. In a first write clock cycle, input data $D_{IN}$ is latched in data in registers 40, and in a write second clock cycle, the input data $D_{IN}$ is written to a location in memory array 32. In the case of consecutive writes into memory array 32, such as during a burst write, input data is provided to data in registers 40 during every clock cycle, while data is being written to a location in memory array 32 during every clock cycle.

If a read cycle follows a write cycle at the same address, such as in a read-after-write, or a registered write, the input data has not been written to memory array 32, but is still latched in data in registers 40. The input data is provided to match sense amplifiers 52 in the same clock cycle that it is being written to memory array 32. In the case when a read cycle follows a write cycle at the same row and column address, an address match signal labeled "ADM*" is used to deselect regular sense amplifiers 54, and to select match sense amplifiers 52 to provide the read data to shared read global data lines RGDL0 through RGDL17. Note that there can be more than one intervening read cycles between the write cycle and the read cycle at the same address.

In order to share the read global data lines for a read-after-write, or a registered write, a new column address being provided to column address buffers 46 is compared to the previous column address that is latched in comparator/latch 50. A new row address is compared to the previous row address in comparator/latch 51. When a match occurs, address match signal ADM* must be generated faster than select signal ASEL is generated, to prevent regular sense amplifiers 54 from being selected. If the regular sense amplifiers are allowed to be selected in the case of a registered write, contention between the regular sense amplifiers and the match sense amplifiers may result. Comparator/latch 50, illustrated in FIG. 4 in greater detail, uses emitter summing on all predecoded column address signals from column decoders 48 to develop the address match signal relatively quickly. Both of comparator/latch 50 and comparator/latch 51 are used to generate a logic low match signal ADM* when a previous address matches a new address. The match sense amplifiers are also emitter summed with the regular sense amplifiers as illustrated in FIGS. 3 and 4.

By sharing the read global data lines, the need for separate match read global data lines is eliminated. This substantially reduces the surface area required on a semiconductor substrate to implement integrated circuit memory 30. The use of emitter summing to generate an address match signal allows the read global data lines to be shared, because the address match signal can be generated very quickly. Also, the need for a multiplexer in the back end is eliminated. In addition, the write path and the read path may be optimally placed along the read global data lines resulting in better signal tracking and simplified layout design of the integrated circuit memory because the match circuits do not have located in the vicinity of the other output circuits.

Figure 3:
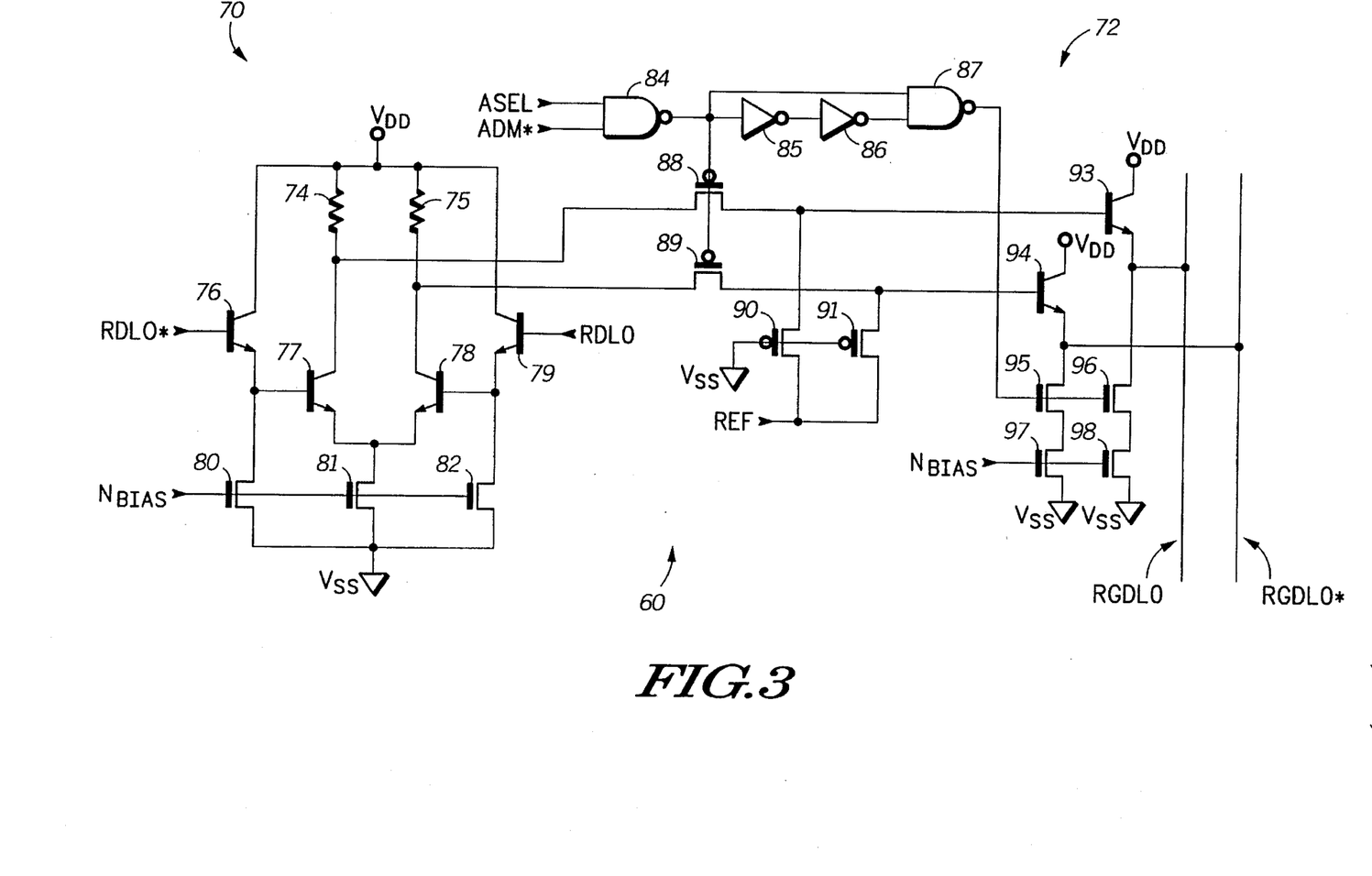
FIG. 3 illustrates, in partial schematic diagram form and partial logic diagram form, a sense amplifier of the integrated circuit memory of FIG. 2.

FIG. 3 illustrates, in partial schematic diagram form and partial logic diagram form, sense amplifier 60 of the integrated circuit memory of FIG. 2. Sense amplifier 60 includes amplifier portion 70 and driver portion 72. Amplifier portion 70 includes resistors 74 and 75, NPN bipolar transistors 76–79, and N-channel MOS (metal-oxide semiconductor) transistors 80, 81, 82. A differential amplifier is formed by resistors 74 and 75, NPN transistors 77 and 78, and N-channel transistor 81. Driver portion 72 includes NAND logic gates 84 and 87, inverters 85 and 86, P-channel transistors 88, 89, 90, and 91, NPN transistors 93 and 94, and N-channel transistors 95, 96, 97, and 98.

Amplifier portion 70 includes a conventional differential amplifier having emitter-follower input transistors 76 and 79. The differential amplifier comprises NPN transistors 77 and 78, resistors 74 and 75, and N-channel transistor 81. Emitter-follower output transistors 93 and 94 are coupled to output terminals of the differential amplifier through P-channel pass transistors 88 and 89, respectively. Emitter-follower transistor 93 has a collector connected to a power supply voltage terminal labeled "$V_{DD}$", a base connected to a drain/source terminal of P-channel transistor 88, and an emitter connected to read global data line RGDL0. Emitter-follower transistor 94 has a collector connected to $V_{DD}$, a base connected to a drain/source terminal of P-channel transistor 89, and an emitter connected to read global data line RGDL0*. N-channel transistors 80, 81, and 82 receive a bias voltage labeled "$N_{BIAS}$" and provide relatively constant current sources for the bipolar transistors. N-channel transistor 80 provides a current source for NPN transistor 76. N-channel transistor 81 provides a current source for the differential amplifier having NPN transistors 77 and 78. N-channel transistor 82 provides a current source for NPN transistor 79. P-channel transistors 88 and 89 function as coupling elements between an output terminal of the differential amplifier and bipolar transistors 93 and 94. $V_{DD}$ is connected to a 3.3 volt power supply voltage and $V_{SS}$ is connected to ground.

N-channel transistor 95 has a drain connected to an emitter of NPN transistor 94, a gate connected to an output terminal of NAND logic gate 87, and a source. N-channel transistors 97 has a drain connected to the source of N-channel transistor 95, a gate for receiving a bias voltage labeled "$N_{BIAS}$", and a source connected to $V_{SS}$. N-channel transistor 96 has a drain connected to an emitter of NPN transistor 93, a gate connected to the output terminal of NAND logic gate 87, and a source. N-channel transistor 98 has a drain connected to the source of N-channel transistor 96, a gate for receiving bias voltage $N_{BIAS}$, and a source connected to $V_{SS}$. P-channel transistors 88 and 89 are conductive and N-channel transistors 95 and 96 provide momentary current sources for NPN transistors 94 and 93, respectively, in response to select signal ASEL being asserted as a logic high and address match signal ADM* being negated as a logic high. The length of time that N-channel transistors 95 and 96 are conductive is determined by a predetermined delay provided by inverters 85 and 86.

During a read cycle of integrated circuit memory 30, differential data signals RDL0* and RDL0 are provided to the bases of NPN transistors 76 and 79, respectively. NPN transistor 77 receives a voltage equal to the voltage of data signal RDL0* minus a base-emitter diode voltage drop ($V_{BE}$) of NPN transistor 76. NPN transistor 78 receives a base voltage equal to the voltage of data signal RDL0 minus a $V_{BE}$ of NPN transistor 79. When data signal RDL0 is a logic high voltage and data signal RDL0* is a logic low voltage, a logic low voltage is provided to a current electrode of P-channel transistor 89, and a logic high voltage is provided to a current electrode of P-channel transistor 88. The data signals are passed to the bases (control electrodes) of emitter-follower NPN transistors 93 and 94 when select signal ASEL is asserted as a logic high and address match signal ADM* is negated as a logic high. The gates of N-channel transistors 95 and 96 are momentarily pulsed with a logic high voltage for a predetermined length of time, causing N-channel transistors 95 and 96 to be momentarily conductive. A voltage of data signal $D_{OUT}0$ is increased to a logic high voltage and a voltage of data signal $D_{OUT}0*$ is decreased to a logic low voltage (FIG. 2).

When P-channel transistors 88 and 89 are substantially non-conductive, relatively weak P-channel transistors 90 and 91 reduce the voltage on the bases of NPN transistors 93 and 94 to a predetermined voltage determined by a reference voltage labeled "REF" to ensure that NPN transistors 93 and 94 are substantially non-conductive and do not affect signals provided to read global data lines RGDL0 and RGDL0* by one of regular sense amplifiers 61 or 62, or by match sense amplifiers 56, 57, or 58 (FIG. 2).

Figure 4:
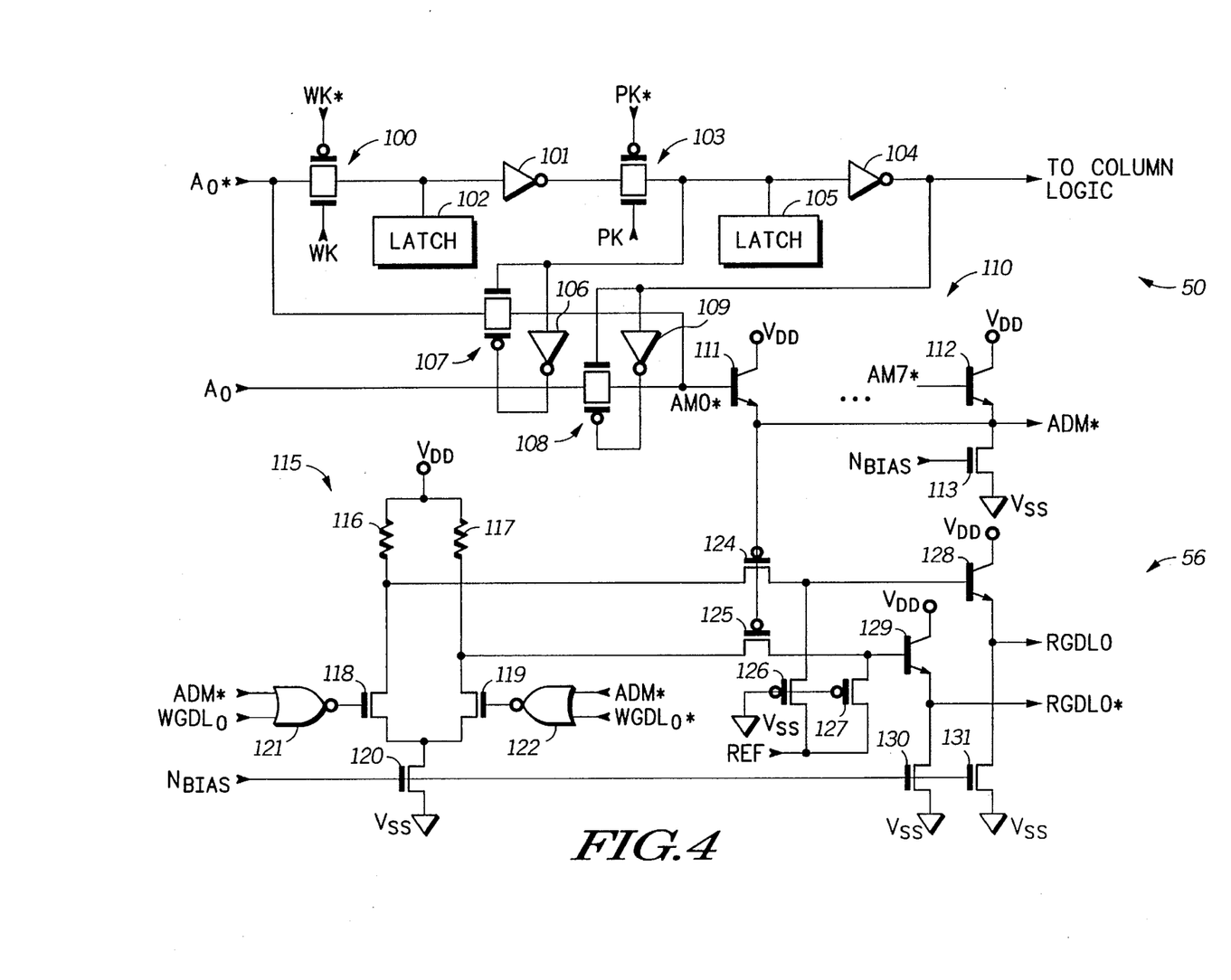
FIG. 4 illustrates, in partial schematic diagram form and partial logic diagram form, a comparator/latch and a match sense amplifier of the integrated circuit memory of FIG. 2.

FIG. 4 illustrates, in partial schematic diagram form and partial logic diagram form, address comparator/latch 50 and match sense amplifier 56 of integrated circuit memory 30 illustrated in FIG. 2. Comparator/latch 50 includes coupling elements 100, 103, 107, and 108 latches 102 and 105, inverters 101, 104, 106, and 109, N-channel transistor 113, and NPN bipolar transistors 111 and 112. Match sense amplifier 56 includes differential amplifier 115, NOR logic gates 121 and 122, N-channel transistors 118, 119, 120, 130, and 131, NPN transistors 128 and 129, and P-channel transistors 124, 125, 126, and 127. Differential amplifier 115 includes resistors 116 and 117, and N-channel transistors 118, 119, and 120.

In comparator/latch 50, coupling element 100 has an input terminal coupled to column decoders 48 for receiving an address signal labeled "$A_0*$", first and second control terminals for receiving differential clock signals labeled "WK*" and "WK", and an output terminal. Latch 102 is connected to the output terminal of coupling element 100. Inverter 102 has an input terminal connected to the output terminal of coupling element 100, and an output terminal. Coupling element 103 has an input terminal connected to the output terminal of inverter 101, first and second control terminals for receiving differential clock signals labeled "PK*" and "PK", and an output terminal. Latch 105 is connected to the output terminal of coupling element 103. Inverter 104 has an input terminal connected to the output terminal of coupling element 103, and an output terminal. Coupling element 107 has an input terminal connected to the input terminal of coupling element 100 for receiving an address signal $A_0^*$, a first control terminal connected to the output terminal of coupling element 103, a second control terminal, and an output terminal for providing an address match signal labeled "AM0*". Inverter 106 has an input terminal connected to the output terminal of coupling element 103, and an output terminal connected to the second control terminal of coupling element 107. Coupling element 108 has an input terminal for receiving an address signal labeled "$A_0$", a first control terminal connected to the output terminal of inverter 104, a second control terminal, and an output terminal connected to the base of NPN transistor 111. Inverter 109 has an input terminal connected to the output terminal of inverter 104, and an output terminal connected to the second control terminal of coupling element 108. Address signal $A_0^*$ is a logical complement of address signal $A_0$.

An emitter-summing circuit 110 includes a plurality of bipolar transistors represented by NPN transistors 111 and 112, and N-channel transistor 113. NPN transistor 111 has a first current electrode (collector) connected to $V_{DD}$, a control electrode (base) connected to the second current electrodes of N-channel transistors 107 and 108, and a second current electrode (emitter) for providing address match signal ADM*. NPN transistor 112 has a collector connected to $V_{DD}$, a base for receiving a match signal labeled "AM7*", and an emitter connected to the emitter of NPN transistor 111. A single N-channel transistor 113 has a first current electrode connected to the emitters of the plurality of bipolar transistors including NPN transistors 111 and 112, a control electrode for receiving bias voltage $N_{BIAS}$, and a second current electrode connected to a power supply voltage terminal labeled "$V_{SS}$".

In match sense amplifier 56, NOR logic gate 121 has a first input terminal for receiving address match signal ADM*, a second input terminal connected to write global data line $WGDL_0$, and an output terminal connected to a gate of N-channel transistor 118. NOR logic gate 122 has a first input terminal for receiving address match signal ADM*, a second input terminal connected to write global data line $WGDL_0^*$, and an output terminal connected to a gate of N-channel transistor 119. The gates of N-channel transistors 118 and 119 are input terminals for differential amplifier 115, and the drain of N-channel transistors 118 and 119 are output terminals. Note that match sense amplifier 56 does not actually perform an amplification function like regular sense amplifier 60 (FIG. 3), but serves to couple input data signals from the data-in registers 40 to a read global data line.

Differential predecoded address signals $A_0$ and $A_0^*$ are provided to comparator/latch 50. Address signals $A_0$ and $A_0^*$ have a relatively large signal swing. A diode-connected bipolar transistor (not shown) is connected to the base of each of NPN transistors 111 through 112 to provided reverse bias protection for NPN transistors 111 through 112. There is a comparator/latch 50 for each of the column address signals COLUMN ADDRESS received by integrated circuit memory 30. Differential clock signals WK*/WK and PK*/PK are non-overlapping clock signals that are derived from clock signal CLK. Differential clock signals WK*/WK and PK*/PK are only used during a write cycle of integrated circuit memory 30. Since address match signal ADM* is active as a logic low, all of match signals AM0* through AM7* (eight column address signals) must be a logic low for address match signal ADM* to be active. When a new address signal $A_0^*$ that is provided to comparator/latch 50 is the same as the previous address $A_0^*$ provided to comparator/latch 50, match signal AM0* is provided to the base of NPN transistor 111 as a logic low, causing the emitter of NPN transistor 111 to provide a logic low. If any one of the comparator/latch circuits provides a logic high match signal to the base of its respective NPN transistor, then address match signal ADM* is negated at a logic high logic state, indicating that the new column address does not match the previous column address. To activate match signal ADM*, all of match signals AM0 through AM7 must be a logic low.

Address match signal ADM* is provided to the gates of P-channel transistors 124 and 125. When the logic state of the new column address signal matches the logic state of the previous column address signal, address match signal ADM* is asserted at a logic low logic state, causing P-channel transistors 124 and 125 of match sense amplifier 56 to be conductive, coupling the output terminals of differential amplifier 115 to the bases of NPN transistors 128 and 129. Also, address match signal ADM* is provided to the first input terminals of NOR logic gates 121 and 122. NOR logic gates 121 and 122 provide an OR logic function for combining $WGDL_0$ and ADM*. When address match signal ADM* is a logic low, the logic levels of the output of NOR logic gates 121 and 122 will be equal to the logic levels of $WGDL_0$ and $WGDL_0^*$, respectively. In addition, address match signal ADM* is provided to the second input terminal of NAND logic gate 84 (FIG. 3, illustrating the data flow from the regular array). When address match signal ADM* is asserted as a logic low, the output of NAND logic gate 84 will be a logic high, causing P-channel transistors 88 and 89 to be substantially non-conductive, decoupling NPN transistors 93 and 94 from the output terminals of the differential amplifier. P-channel transistors 90 and 91 cause the bases of NPN transistors 93 and 94, respectively, to be maintained at a low voltage to prevent NPN transistors 93 and 94 from becoming inadvertently conductive.

During a read-after write, or a registered write, the new address is compared to the previous address and an address match signal ADM* is generated before select signal ASEL is generated so that regular sense amplifiers 54 are deselected before data is provided to the read global data lines by match sense amplifiers 52. As stated above, there can be intervening read cycles between the read cycle and the previous write cycle. By quickly generating the address match signal, the read global data lines can be shared between read data from the memory array and read-after-write data from the input data buffers by using emitter summing. The use of emitter summing reduces a gate delay, thus allowing the match signal to be generated before the regular sense amplifiers can be selected, and allows the read global data lines to be shared without increasing the access time of the integrated circuit memory (30). In an integrated circuit memory having a relatively wide word width, substantial savings in surface area is realized by sharing the read global data lines in this manner. Also, the need for a separate multiplexer in the back end is eliminated, and better signal tracking between the match data and regular data results. In addition, because the regular sense amplifiers are not selected during a read-after-write or during a registered write, power consumption is reduced.

While the invention has been described in the context of a preferred embodiment, it will be apparent to those skilled in the art that the present invention may be modified in numerous ways and may assume many embodiments other than that specifically set out and described above. For example, in the illustrated embodiment, integrated circuit memory 30 is described as comprising SRAM cells. However, in other embodiments, integrated circuit memory 30 may comprise dynamic random access memory (DRAM) cells, electrically erasable programmable random access memory (EEPROM) cells, any other type of volatile or nonvolatile memory cells. Accordingly, it is intended by the appended claims to cover all modifications of the invention which fall within the true spirit and scope of the invention.

What is claimed is:

1. An integrated circuit memory, comprising:

a memory array having a plurality of memory cells organized in a plurality of rows and a plurality of columns;

an input data register having an input terminal for receiving an input data signal, and an output terminal;

a first sense amplifier having an input terminal coupled to the output terminal of the input data register, and an output terminal;

a second sense amplifier having an input terminal coupled to the memory array, and an output terminal; and a global data line, coupled to the output terminal of the first sense amplifier and to the output terminal of the second sense amplifier.

2. The integrated circuit memory of claim 1, wherein the first sense amplifier comprises:

a differential amplifier having an input terminal for receiving the input data signal, and an output terminal;

a pass transistor having a first current electrode coupled to the output terminal of the differential amplifier, a control electrode for receiving an address match signal, and a second current electrode; and an emitter-follower transistor having a first current electrode coupled to a power supply voltage terminal, a control electrode coupled to the second current electrode of the pass transistor, and a second current electrode coupled to the global data line.

3. The integrated circuit memory of claim 2, further comprising a logic gate for performing an OR logic function having a first input terminal for receiving the address match signal, a second input terminal coupled to the input data register, and an output terminal coupled to the input terminal of the differential amplifier.

4. The integrated circuit memory of claim 1, wherein the plurality of memory cells is characterized as being a plurality of static random access memory cells.

5. The integrated circuit memory of claim 1, wherein the second sense amplifier comprises:

a differential amplifier having an input terminal coupled to the memory array for receiving a data signal corresponding to data stored in a selected memory cell, and an output terminal;

a pass transistor having a first current electrode coupled to the output terminal of the differential amplifier, a control electrode responsive to an address match signal, and a second current electrode; and an emitter-follower transistor having a first current electrode coupled to a power supply voltage terminal, a control electrode coupled to the second current electrode of the pass transistor, and a second current electrode coupled to the global data line.

6. The integrated circuit memory of claim 1, further comprising an address comparator for comparing a logic state of a first address signal to a logic state of a second address signal, and in response to the address comparator detecting a match, providing an address match signal.

7. The integrated circuit memory of claim 6, wherein the comparator comprises:

a first coupling element having an input terminal for receiving the first address signal, an output terminal, and a control terminal for receiving a first clock signal;

a first latch coupled to the output terminal of the first coupling element;

a first inverter having an input terminal coupled to the output terminal of the first coupling element, and an output terminal;

a second coupling element having an input terminal coupled to the output terminal of the first inverter, an output terminal, and a control terminal for receiving a second clock signal;

a second latch coupled to the output terminal of the first inverter;

a second inverter having an input terminal coupled to the output terminal of the second coupling element, and an output terminal;

a first transistor having a first current electrode coupled to the input terminal of the first coupling element, a control electrode coupled to the output terminal of the second coupling element, and a second current electrode;

a second transistor having a first current electrode for receiving a logical complement of the first address signal, a control electrode coupled to the output terminal of the second inverter, and a second current electrode coupled to the second current electrode of the first transistor; and an emitter-summing circuit including a plurality of bipolar transistors, a bipolar transistor of the plurality of bipolar transistors having a base coupled to the second current electrodes of the first and second transistors, a collector coupled to a power supply voltage terminal, and an emitter for providing the address match signal.

8. The integrated circuit memory of claim 7, wherein the first clock signal is non-overlapping with respect to the second clock signal.

9. An integrated circuit memory, comprising:

a memory array having a plurality of memory cells organized in a plurality of rows and a plurality of columns;

an input data register having an input terminal for receiving an input data signal, and an output terminal;

a first sense amplifier having an input terminal coupled to the output terminal of the input data register, and an output terminal;

a second sense amplifier having an input terminal coupled to the memory array, and an output terminal; and a read global data line, coupled to the output terminal of the first sense amplifier and to the output terminal of the second sense amplifier, the read global data line for receiving data signals from the first sense amplifier in response to an address match signal having a first logic state, and for receiving data signal from the second sense amplifier in response to the address match signal having a second logic state.

10. The integrated circuit memory of claim 9, wherein the plurality of memory cells is characterized as being a plurality of static random access memory cells.

11. The integrated circuit memory of claim 9, wherein the first sense amplifier comprises:

a differential amplifier having an input terminal for receiving the input data signal, and an output terminal;

a pass transistor having a first current electrode coupled to the output terminal of the differential amplifier, a control electrode for receiving the address match signal, and a second current electrode; and an emitter-follower transistor having a first current electrode coupled to a power supply voltage terminal, a control electrode coupled to the second current electrode of the pass transistor, and a second current electrode coupled to the read global data line.

12. The integrated circuit memory of claim 11, further comprising a logic gate for performing an OR logic function having a first input terminal for receiving the address match signal, a second input terminal coupled to the input data register, and an output terminal coupled to the input terminal of the differential amplifier.

13. The integrated circuit memory of claim 9, wherein the second sense amplifier comprises:

a differential amplifier having an input terminal coupled to the memory array for receiving a data signal corresponding to data stored in a selected memory cell, and an output terminal;

a pass transistor having a first current electrode coupled to the output terminal of the differential amplifier, a control electrode responsive to the address match signal, and a second current electrode; and an emitter-follower transistor having a first current electrode coupled to a power supply voltage terminal, a control electrode coupled to the second current electrode of the pass transistor, and a second current electrode coupled to the read global data line.

14. The integrated circuit memory of claim 9, further comprising an address comparator for comparing a logic state of a first address signal to a logic state of a second address signal, and in response to the address comparator detecting a match between the first and second address signals, providing the address match signal having the first logic state.

15. The integrated circuit memory of claim 14, wherein the comparator comprises:

a first coupling element having an input terminal for receiving the first address signal, an output terminal, and a control terminal for receiving a first clock signal;

a first latch coupled to the output terminal of the first coupling element;

a first inverter having an input terminal coupled to the output terminal of the first coupling element, and an output terminal;

a second coupling element having an input terminal coupled to the output terminal of the first inverter, an output terminal, and a control terminal for receiving a second clock signal;

a second latch coupled to the output terminal of the first inverter;

a second inverter having an input terminal coupled to the output terminal of the second coupling element, and an output terminal;

a first transistor having a first current electrode coupled to the input terminal of the first coupling element, a control electrode coupled to the output terminal of the second coupling element, and a second current electrode;

a second transistor having a first current electrode for receiving a logical complement of the first address signal, a control electrode coupled to the output terminal of the second inverter, and a second current electrode coupled to the second current electrode of the first transistor; and an emitter-summing circuit including a plurality of bipolar transistors, a bipolar transistor of the plurality of bipolar transistors having a base coupled to the second current electrodes of the first and second transistors, a collector coupled to a power supply voltage terminal, and an emitter for providing the address match signal.

16. The integrated circuit memory of claim 15, wherein the first clock signal is non-overlapping with respect to the second clock signal.

17. An integrated circuit memory, comprising:

a memory array having a plurality of memory cells organized in a plurality of rows and a plurality of columns;

an input data register having an input terminal for receiving an input data signal, and an output terminal;

a first sense amplifier having an input terminal coupled to the output terminal of the input data register, and an output terminal;

a second sense amplifier having an input terminal coupled to the memory array, and an output terminal;

an address comparator, coupled to the first and second sense amplifier, for comparing a logic state of a previous address signal to a logic state of a new address signal, and in response to the address comparator detecting a match between the previous address signal and the new address signal, providing an address match signal having a first logic state; and a read global data line, coupled to the output terminal of the first sense amplifier and to the output terminal of the second sense amplifier, the read global data line for receiving data signals from the first sense amplifier in response to the address match signal having the first logic state, and for receiving data signal from the second sense amplifier in response to the address match signal having a second logic state.

18. The integrated circuit memory of claim 17, wherein the first sense amplifier comprises:

a differential amplifier having an input terminal for receiving the input data signal, and an output terminal;

a pass transistor having a first current electrode coupled to the output terminal of the differential amplifier, a control electrode for receiving the address match signal, and a second current electrode; and an emitter-follower transistor having a first current electrode coupled to a power supply voltage terminal, a control electrode coupled to the second current electrode of the pass transistor, and a second current electrode coupled to the read global data line.

19. The integrated circuit memory of claim 17, wherein the second sense amplifier comprises:

a differential amplifier having an input terminal coupled to the memory array for receiving a data signal corresponding to data stored in a selected memory cell, and an output terminal;

a pass transistor having a first current electrode coupled to the output terminal of the differential amplifier, a control electrode responsive to the address match signal, and a second current electrode; and an emitter-follower transistor having a first current electrode coupled to a power supply voltage terminal, a control electrode coupled to the second current electrode of the pass transistor, and a second current electrode coupled to the read global data line.

20. The integrated circuit memory of claim 17, wherein the address comparator comprises:

a first coupling element having an input terminal for receiving a first address signal, an output terminal, and a control terminal for receiving a first clock signal;

a first latch coupled to the output terminal of the first coupling element;

a first inverter having an input terminal coupled to the output terminal of the first coupling element, and an output terminal;

a second coupling element having an input terminal coupled to the output terminal of the first inverter, an output terminal, and a control terminal for receiving a second clock signal;

a second latch coupled to the output terminal of the first inverter;

a second inverter having an input terminal coupled to the output terminal of the second coupling element, and an output terminal;

a first transistor having a first current electrode coupled to the input terminal of the first coupling element, a control electrode coupled to the output terminal of the second coupling element, and a second current electrode;

a second transistor having a first current electrode for receiving a logical complement of the first address signal, a control electrode coupled to the output terminal of the second inverter, and a second current electrode coupled to the second current electrode of the first transistor; and an emitter-summing circuit including a plurality of bipolar transistors, a bipolar transistor of the plurality of bipolar transistors having a base coupled to the second current electrodes of the first and second transistors, a collector coupled to a power supply voltage terminal, and an emitter for providing the address match signal.

* * * * *